United States Patent [19]

Kihara et al.

[11] Patent Number: 4,914,575
[45] Date of Patent: Apr. 3, 1990

[54] SYSTEM FOR TRANSFERRING DATA BETWEEN AN INTERLEAVED MAIN MEMORY AND AN I/O DEVICE AT HIGH SPEED

[75] Inventors: Jun-ichi Kihara; Hiroyuki Kaneko, both of Tokyo, Japan

[73] Assignee: Kabushiki Kaisha Toshiba, Kawasaki, Japan

[21] Appl. No.: 89,988

[22] Filed: Aug. 27, 1987

[30] Foreign Application Priority Data

Aug. 28, 1986 [JP] Japan ............... 61-202075

[51] Int. Cl.⁴ .................. G06F 12/06; G06F 13/28
[52] U.S. Cl. .................. 364/200; 364/242.3; 364/246.4; 364/251.3; 364/254.1; 364/254.4; 364/254.9
[58] Field of Search ... 364/200 MS File, 900 MS File

[56] References Cited

U.S. PATENT DOCUMENTS

| | | | |
|---|---|---|---|
| 4,027,291 | 5/1977 | Tokura et al. | 340/172.5 |
| 4,099,231 | 7/1978 | Kotok et al. | 364/200 |
| 4,122,520 | 10/1978 | Adamchick et al. | 364/200 |
| 4,157,587 | 6/1979 | Joyce et al. | 364/200 |
| 4,214,304 | 7/1980 | Shimizu et al. | 364/200 |
| 4,366,539 | 12/1982 | Johnson et al. | 364/200 |
| 4,403,282 | 9/1983 | Holberger et al. | 364/200 |
| 4,467,419 | 8/1984 | Wakai | 364/200 |
| 4,598,362 | 7/1986 | Kinjo et al. | 364/200 |
| 4,669,056 | 5/1987 | Waldecker et al. | 364/900 |
| 4,723,223 | 2/1988 | Hanada | 364/900 |

OTHER PUBLICATIONS

Ivan Tomek, Introduction to Computer Organization, 1981, pp. 391-392, Computer Science Press, Inc., Rockille, Md.

Jean-Loup Baer, Computer System Architecture 1980, pp. 238-249, Computer Science Press, Inc., Rockville, Md.

Primary Examiner—Raulfe B. Zache
Assistant Examiner—Florin Munteanu-R.
Attorney, Agent, or Firm—Cushman, Darby & Cushman

[57] ABSTRACT

An input/output channel apparatus includes a system bus controller for generating a memory read request and outputting a memory address. Generation of the memory read request is inhibited in response to a request inhibit instruction generated by a request-inhibit generating section. When a memory bank other than one accessed in response to the immediately preceding memory read request is accessed, the request-inhibit instruction is generated. The request-inhibit instruction is canceled when memory interleaved data on the basis of the memory read requests for the same memory bank are input to a buffer in the apparatus.

13 Claims, 3 Drawing Sheets

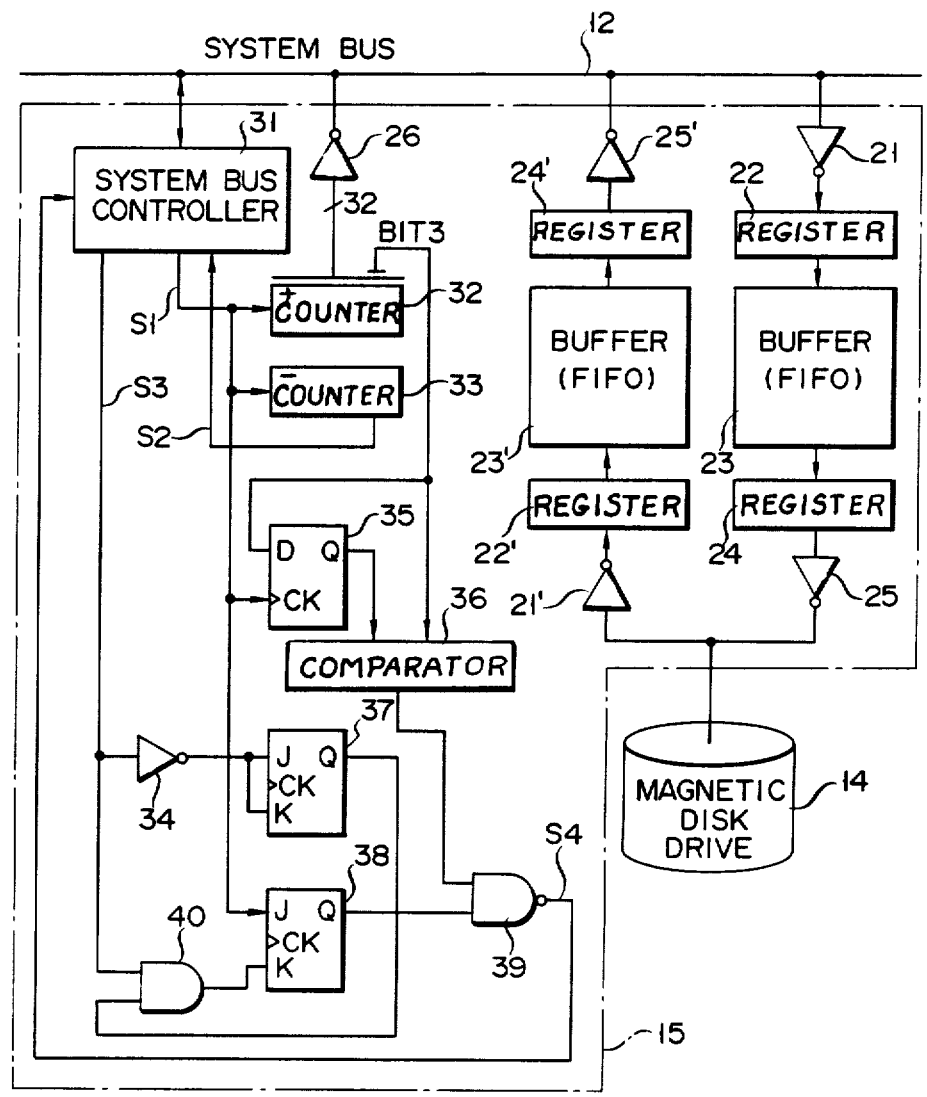
F I G. 3

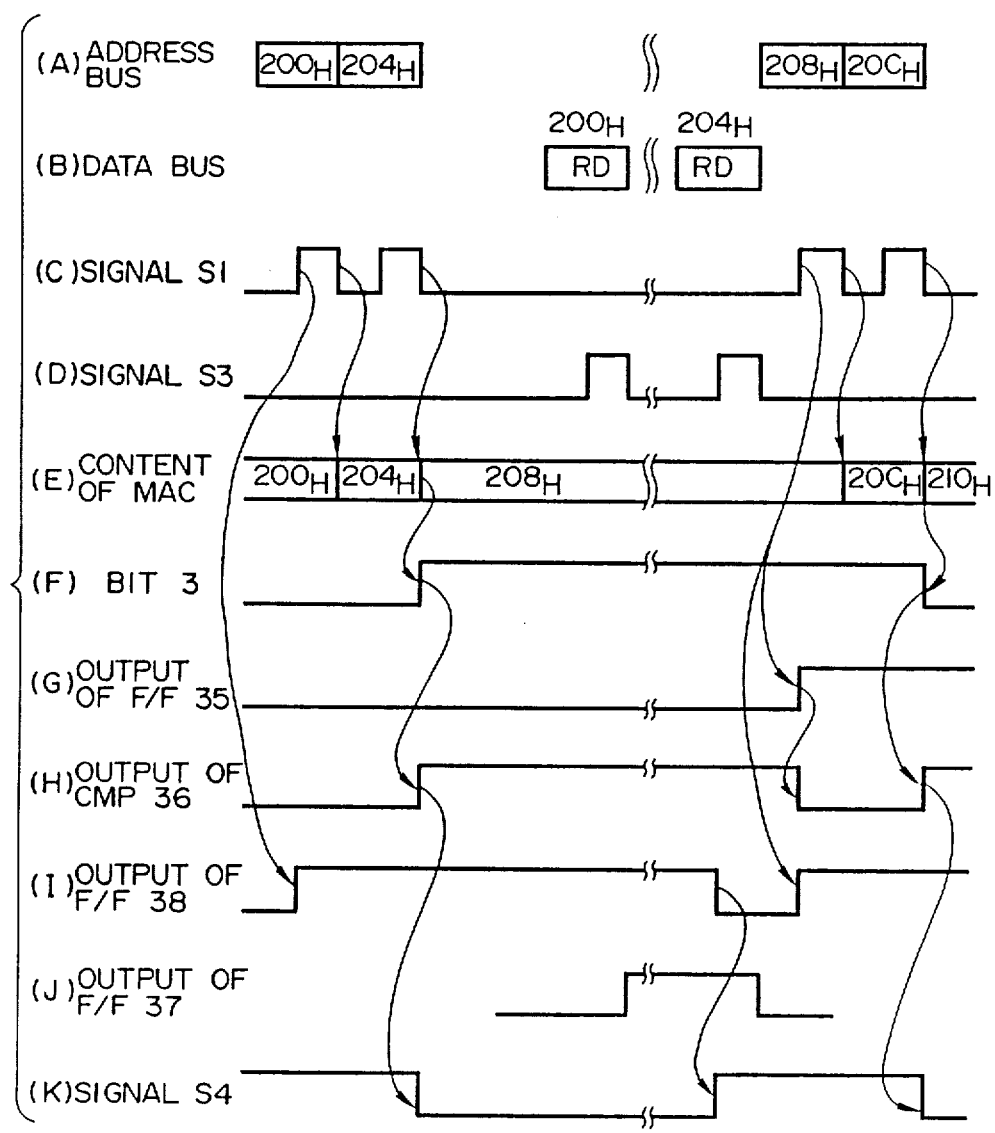
F I G. 4

SYSTEM FOR TRANSFERRING DATA BETWEEN AN INTERLEAVED MAIN MEMORY AND AN I/O DEVICE AT HIGH SPEED

BACKGROUND OF THE INVENTION

The present invention relates to a method of controlling the transfer of read data, having a data length corresponding to a data bus width, between a high-speed input/output device (e.g., a magnetic disk drive) and a main memory for interleaving data having a data length which is a plurality of times the data bus width, and an input/output channel apparatus for realizing the method.

Data transfer between a main memory and an input/output device, via a conventional input/output channel apparatus, is performed in units of data bus widths. Memory interleaving is utilized in the main memory, to improve its performance. The length of data to be interleaved is a plurality of times the data bus width.

For some time, there has been strong demand for an increase in the speed data transfer through the input/output apparatus. When write accessing is performed, a memory write request, a write address, and write data are transferred to the main memory, and transfer delay with respect to the input/output channel apparatus does not occur. So as to increase the data transfer speed during read access, for reading out data from the main memory to the input/output device, a memory read request may be output to the main memory, and then the next memory read request may be output before the read data in response to the first memory read request is sent to the input/output device. However, as is shown in U.S. Pat. No. 4,598,362, a memory control unit in the main memory processes a request for a not-busy memory bank first. Therefore, there is no assurance that the input/output channel apparatus will receive read-out data in the same order as that of requests due to the dependency of the read out operation on the busy status of the respective memory banks. For this reason, a data string may be output in a disordered fashion. In order to solve this problem, tag information may be added to a memory read request, and the read-out data ordered in accordance with the tag information. However, such a control scheme is complex, resulting in inconvenience.

If the length of the transfer data matches with the boundaries between the memory banks of the main memory, the arrangement of the input/output channel apparatus can be simplified slightly. However, the size of the data bus area occupying the back plane is then undesirably increased. In order to realize a compact product, the data bus width in the system bus must be minimized. However, if the data length, i.e., the data bus width, is excessively decreased, the control process required for transferring data of a length defined by boundaries of the memory banks becomes more complicated, thereby decreasing the data transfer speed.

SUMMARY OF THE INVENTION

The present invention has been developed with regard to the above situation, and has as its object to provide a method of controlling the transfer of read-out data, of a length corresponding to a data bus width, between a high-speed input/output device (e.g., a magnetic disk drive) and a main memory for interleaving data of a length which is a plurality of times the data bus width, and to provide an input/output channel apparatus for realizing the method.

In order to achieve the above object of the present invention, an input/output channel apparatus comprises a buffer; for transferring data, having an m-bit data width, from a main memory to an I/O device via the buffer, the main memory including a plurality of memory banks, each of which stores data having 2n times the m-bit data width, and a memory control unit for performing memory interleaving for the plurality of memory banks, in units of 2n times the m-bit data width, and which comprises address retaining means for retaining an input address, for updating the retained address in response to each of a series of timing signals, and for retaining the updated address; coincidence-signal generating means for selectively generating a coincidence signal, based on the retained address, before updating and after updating; inhibit-signal generating means for selectively generating an inhibit signal in accordance with the absence of the coincidence signal and a series of response signals; and control means for selectively generating the series of memory read requests to the main memory in accordance with the inhibit signal, so as to access one memory bank in the main memory. The control means causes the address retaining means to output the retained address to the main memory, in response to the generation of each of the series of memory read requests, generates the series of timing signals to the address retaining means and the inhibit-signal generation means, after the retained address is output, and generates each of the series of response signals to the inhibit-signal generating means while the data having the m-bit data width corresponding to the series of memory read requests are input from the main memory to the buffer.

In order to achieve the above object of the present invention, the method comprises transferring data, having an m-bit data width, between an I/O port and a main memory having a plurality of memory banks and adapted to memory interleave data having n times the m-bit data width, comprising the steps of: (1) retaining an address for the main memory and a transfer word count, in response to a transfer instruction, (2) selectively generating a request-inhibit instruction, on the basis of the retained address, (3) generating the memory read request in the absence of the request-inhibit instruction, and (4) generating the retained address in accordance with the generated memory read request, in order to read out the memory interleaved data, the retained address signal being updated and retained after the retained address is generated.

In the input/output channel apparatus of the present invention described above, memory read requests can be output continuously, regardless of the main memory reading out read data from a memory area at a memory read address output in the immediately preceding memory read access cycle. If the memory read requests are output continuously to one memory bank in the main memory, processing is performed in accordance with the request order. For example, assuming that a plurality of access cycles are performed using a data bus whose width is smaller than a unit data length in memory interleaving; even if one of the memory banks being busy due to accesses is frequently accessed by other channel apparatus or the like, the transfer speed of the read data from the main memory to the input/output device can still be increased. In addition, the order of data read out is the same as the order of the memory read requests, and a complicated method and control circuit for rearranging a scrambled order of read-out data is not required.

BRIEF DESCRIPTION OF THE DRAWINGS

FIG. 3 is a detailed block diagram of the input/output channel apparatus of FIG. 1, according to an embodiment of the present invention; and FIG. 4 shows timing charts 4A to 4K for explaining the operation of the embodiment shown in FIG. 3.

DETAILED DESCRIPTION OF THE PREFERRED EMBODIMENT

Figures 1, 2:
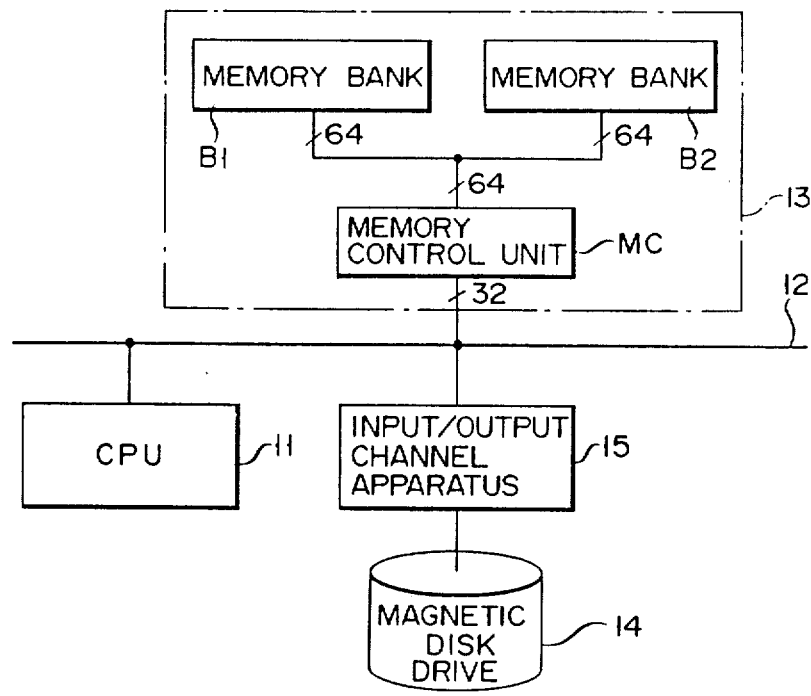
FIG. 1 is a block diagram showing a configuration of a computer system to which the present invention is applied.
FIG. 2 is a memory map showing the assignment of addresses, when viewed from an input/output channel apparatus of the present invention, to memory banks in a main memory.

An input/output channel apparatus for controlling data transfer according to an embodiment of the present invention will now be described, with reference to the accompanying drawings.

The configuration of a computer system employing the input/output channel apparatus of the present invention will first of all be described with reference to FIG. 1. Referring to FIG. 1, main memory 13 is connected via system bus 12 to CPU 11 as the principal component in the computer system. Bus 12 includes data, address, and control buses, and its width, in this embodiment, is 32 bits (4 bytes). Main memory 13 comprises two memory banks, B1 and B2, each of which is accessed in units of 8 bytes (=64 bits), and memory control unit MC for controlling accessing of memory banks B1 and B2. Main memory 13 performs memory interleaving of data in units of a data length corresponding to a plurality of times the data bus width (32 bits), for example, 64 bits (8 bytes); in this embodiment.

When, in the course of read accessing, memory read requests are concentrated on one memory bank in main memory 13, read data are read out therefrom in the same order as that of input requests, and are output onto system bus 12. However, even if memory read requests for memory banks B1 and B2 are input in a given order, there is no assurance that the read data will be read out in the same order as that of the read requests if a specific memory bank, e.g., memory bank B1, is frequently accessed by other apparatus. In order to increase the throughput, unit MC reads out read data from an available memory bank in order. This operation is described in detail in U.S. Pat. No. 4,598,362.

Input/output device 14, for example, a magnetic disk drive, is connected to CPU 11 via system bus 12 and input/output channel apparatus 15. Disk drive 14 is initialized, in response to an input/output instruction from CPU 11, to exchange data with main memory 13, under the control of input/output channel apparatus 15 of the present invention.

In this embodiment, addresses are assigned to memory banks B1 and B2, in main memory 13, in units of bytes, as is shown in FIG. 2. As is apparent from FIG. 2, addresses 0H and 4H (H denotes the hexadecimal notation) are respectively assigned to the upper and lower four bytes of the eight bytes constituting address 0H of memory bank B1. Addresses 8H and CH are respectively assigned to the upper and lower four bytes of the eight bytes constituting address 0H of memory bank B2. Similarly, addresses 10H and 14H are assigned to the upper and lower four bytes of the eight bytes constituting address 1H of memory bank B1, and addresses 18H and 1CH are respectively assigned to the upper and lower four bytes of the eight bytes constituting address 1H of memory bank B2. In this manner, the memory addresses are alternately assigned, in units of 8H, to memory banks B1 and B2.

If the memory address data comprises 32-bit data consisting of bit 31 (MSB) to bit 0 (LSB), bit 3, i.e., the fourth bit from the LSB, denotes that the address corresponds to memory bank B1 or B2. More specifically, if bit 3 is logic "0", the address corresponds to memory bank B1. However, if bit 3 is logic "1", the address corresponds to memory bank B2. If bit data of bit 2, i.e., the third bit from the LSB is logic "0", the address represents the upper four bytes of the 8-byte data stored in memory bank B1 or B2. If bit 2 is logic "1", the address represents the lower four bytes.

The arrangement of the input/output channel apparatus according to an embodiment of the present invention will now be described with reference to FIG. 3.

Referring to FIG. 3, during memory read accessing, receiver 21 in input/output channel apparatus 15 receives read data from main memory 13 via a data bus in system bus 12. The read data input to receiver 21 is latched in register 22 and is temporarily stored, in the order of input, in FIFO buffer 23, in response to a write control signal (not shown). The read data is sequentially read out from buffer 23, in response to a read control signal (not shown), in the same order as it was stored, and is latched in register 24. The read data is then sent by driver 25 to magnetic disk driver 14, via a local bus.

In memory write access, receiver 21' in input/output channel apparatus 15 receives write data from magnetic disk drive 14, via the local bus. The write data input to receiver 21' is latched in register 22' and is temporarily stored, in the order of input, in FIFO buffer 23', in response to a write control signal (not shown). The write data sequentially read out from buffer 23', in response to a read control signal, is stored in register 24' and is output by driver 25' to main memory 13, via system bus 12.

When an input/output instruction is input from CPU 11 to input/output channel apparatus 15, a start address and a transfer word count which are specified by this instruction are respectively set in memory address counter 32 and transfer word counter 33. Then, system bus controller 31 generates a memory read request for main memory 13, in accordance with the instruction from CPU 11. Controller 31 commands driver 26 to output simultaneously the contents of counter 32 to the main memory. System bus controller 31 then generates memory request timing signal S1 which is active in response to request generation. Signal S1 is output to memory address counter 32, transfer word counter 33, D flip-flop (F/F) 35, and JK flip-flop (F/F) 38.

Counter 32 is constituted by a 32-bit address counter. The address data stored in counter 32 is supplied to main memory 13 via driver 26, which is controlled by system bus controller 31, and via system bus 12. Bit 3 of the address data is supplied to the D input terminal of F/F 35 and comparator 36. In order to access the next memory address in main memory 13, the address data stored in counter 32 is incremented by "4", in response to the trailing edge of request timing signal S1. Counter 33 holds the transfer word count in units of 4 bytes (one word). The word count is decremented by "1", in response to the trailing edge of signal S1, and the remaining count of transfer words to be exchanged between main memory 13 and magnetic disk drive 14 is indicated. When its count reaches zero, counter 33 supplies transfer end signal S2 to system bus controller 31.

F/F 35 latches a memory bank designation address portion of the address data stored in ;counter 32. In this case, this address portion, i.e., bit 3, is latched in response to the leading edge of signal S1, and the latched Q output is supplied to comparator 36.

Comparator 36 compares the Q output data from F/F 35 with data of bit 3 of the address data stored in memory address counter 32. If a coincidence between these data is established, comparator 36 outputs a coincidence signal of logic "0".

Inverter 34 inverts response signal S3 output from system bus controller 31. The inverted signal is input to the J and K terminals of JK flip-flop (F/F) 37. Signal S3 becomes active each time read data is input from main memory 13 to input/output channel apparatus 15. A Q output of F/F 37 is inverted in response to the trailing edge of response signal S3, and is input to one input terminal of AND gate 40. Signal S3 is supplied to the other input terminal thereof. JK flip-flop (F/F) 38 receives signal S1 at the J terminal thereof and an output from AND gate 40, at the K terminal thereof. F/F 38 is set in response to memory request timing signal S1, and is reset in response to the output signal from AND gate 40. The output from F/F 38 indicates that read data for the memory read request is not yet input. 2-input AND gate 39 receives an output from comparator 36 and a Q output from F/F 38. The output from gate 39 is supplied to system bus controller 31 as memory read request inhibit signal S4 of active low.

The operation of the embodiment will now be described with reference to FIGS. 4A to 4K, wherein input/output channel apparatus 15 read-accesses main memory 13, to transfer data from main memory 13 to magnetic disk drive 14.

In response to an input instruction from CPU 11 to a microprocessor (not shown) in input/output channel apparatus 15, a memory start address (200H in this case) is set in memory address counter 32 and a transfer word count is set in transfer word counter 33 under the control of the microprocessor. System bus controller 31 outputs a memory read request to main memory 13 via system bus 12 also under the control of the microprocessor, and commands driver 26 to output the memory address (200H) from counter 32, as is shown in FIG. 4A. After controller 31 outputs the memory read request, memory request timing signal S1 is output to counters 32 and 33 and F/Fs 35 and 38, as is shown in FIG. 4C.

Data of bit 3 of the memory address (200H) held in memory address counter 32 is latched by F/F 35, in response to the leading edge of signal S1. In this state, the bit 3 data is logic "0" and logic "0" is latched in response to the leading edge of signal S1, as is shown in FIG. 4G. F/F 38 is set in response to the leading edge of signal S1, and a Q output signal thereof is inverted from logic "0" to logic "1", as is shown in FIG. 4I.

Counter 32 increments the held address by 4, in response to the trailing edge of signal S1. The memory read address stored in counter 32 is updated to 204H, as is shown in FIG. 4E, and counter 33 decrements the word count by one, also in response to the trailing edge of signal S1.

Bit data (logic "0") of bit 3 of the updated address (204H) in memory address counter 32 is supplied to the D input of F/F 35 and to one input terminal of comparator 36. The Q output signal (logic "0") from F/F 35 is input to the other input terminal of comparator 36, and is compared, by comparator 36, with bit data of bit 3 from counter 32. If a coincidence is established, i.e., if the memory bank designated by the memory read address to be output next onto system bus 12 coincides with the memory bank designated by the memory address previously output onto system bus 12, then, as is shown in FIG. 4H, comparator 36 outputs a coincidence signal of logic "0", which is input to one input terminal of NAND gate 39. Since this output signal is set at logic "0", then, as is shown in FIG. 4K, request-inhibit signal S4, as an output signal from NAND gate 39, is set at logic "1" and is supplied to system bus controller 31.

Since signal S4 is set at logic "1", system bus controller 31 determines, therefore, that the memory read request has not been inhibited, and thus, the next memory read request can be output onto system bus 12 before data read out from main memory, in response to the memory read request output on the basis of memory read address 200H, is sent to input/output channel apparatus 15. In this case, the memory read address 204H stored in memory address counter 32 is output onto system bus 12 via driver 26.

When a new memory read request is output onto system bus 12, under the control of system bus controller 31, memory request timing signal S1 is again output, as is shown in FIG. 4C. In response to the leading edge of signal S1, bit data of bit 3 of the memory address signal (204H) stored in counter 32 is latched by F/F 35. In response to the trailing edge of signal S1, the content of memory address counter 32 is incremented by 4, the current address is updated to a memory address (208H) for the next memory read request, and the content of transfer word counter 33 is decremented by one.

When the memory read address stored in counter 32 represents address 208H, the bit data of bit 3 is set at logic "1". In this case, since bit data, i.e., "0" data, of bit 3 of the memory read address (204H) is latched by F/F 35, an output signal from comparator 36 is inverted to logic "1" (FIG. 4H) at the timing when the memory address stored in counter 32 is updated to the address 208H, and is supplied to one input terminal of NAND gate 39. A Q output signal from F/F 38 is supplied to the other input terminal of NAND gate 39. In this case, since the Q output signal from F/F 38 and the output signal from comparator 36 are both logic "1", i.e., when the memory read request is being sent and the memory bank designated by the current memory address differs from that by the previous memory address, then, as is shown in FIG. 4K, request inhibit signal S4, as an output signal from NAND gate 39, is set at logic "0". Since signal S4 is set at logic "0", controller 31 therefore determines that the memory read request has been inhibited, and thus, the next memory read request on the basis of the memory address (208H) currently held in counter 32 is inhibited.

When a memory read request is output onto system bus 12, under the control of controller 31 in input/output channel apparatus 15, memory control unit MC in main memory 13 read-accesses the memory bank (if memory addresses are 200H and 204H, memory bank B1 is accessed) designated by bit data of bit 3 of the memory address signal output onto system bus 12 by driver 26. In this case, all bits except for the lower four bits of the address (i.e., 28 bits from bit 31 to bit 4) are used for read accessing. Memory control unit MC performs memory read accessing for a single bank, in the same order as that of the read requests, in response to memory read request for the single memory bank. Even if the next read request is input before the read data accessed in response to the immediately preceding memory request is output to the input/output channel apparatus, there is no danger of the data becoming disordered. When memory control unit MC receives 8-byte read data from the memory bank, the upper four bytes of the read data are sent to input/output channel apparatus 15, as the read data corresponding to the first memory read request. Subsequently, the lower four bytes of the read data are also sent to input/output channel apparatus 15. Such read data is supplied to data buffer 23 via receiver 21 and register 22 in input/output channel apparatus 15, and is temporarily stored therein.

When read data corresponding to memory read address 200H is sent to input/output channel apparatus 15, then, as is shown in FIG. 4D, controller 31 outputs response signal S3. Signal S3 is supplied to one input terminal of AND gate 40, is inverted by inverter 34 and the inverted signal is supplied to the J and K input terminals of F/F 37. The Q output from F/F 37 is inverted in response to the trailing edge of signal S3, and serves as a signal of logic "1", as is shown in FIG. 4J. In other words, F/F 37 is kept reset until signal $\overline{S3}$ rises, and a Q output signal from F/F 37 is set at logic "0", and supplied to the other input terminal of AND gate 40. An output signal from AND gate 40 is supplied to the K input terminal of F/F 38. If the output signal from F/F 37 is logic "0", then, the output signal from AND gate 40 is logic "0", regardless of the logical state of response signal S3. Therefore, F/F 38 remains at the current state, i.e., the state at which the memory read request is set. The state of F/F 37 is changed from the reset state to the set state, in response to the trailing edge of signal $\overline{S3}$, and a Q output signal therefrom is inverted from logic "0" to logic "1", as is shown in FIG. 4J.

When read data corresponding to memory address 204H is sent to input/output channel apparatus 15, after the read data corresponding to memory read address 200H is sent thereto, system bus controller 31 outputs the second response signal S3, as is shown in FIG. 4D. In this case, the Q output signal from F/F 37 is reset at logic "0". When the Q output signal from F/F 37 is set at logic "1", the output signal from AND gate 40 is set at logic "1", in response to the leading edge of response signal S3. As is shown in FIG. 4I, F/F 38 is reset. F/F 38 is set when the memory read request is output from system bus controller 31 to system bus 12, while F/F 38 is reset when the second read data is received by input/output channel apparatus 15. F/F 37 is reset again in response to the trailing edge of the second or last response signal S3. In other words, F/F 37 detects whenever all read data is sent from main memory 13, and acts a counter.

When F/F 38 is reset, its Q output signal is inverted to logic "0", as is shown in FIG. 4I, and memory read request-inhibit signal S4, as an output signal from NAND gate 39, is inverted to logic "1", as is shown in FIG. 4K. When signal S4 is inverted to logic "1", system bus controller 31 then determines that the memory read request inhibition is canceled, and thus resumes memory read request generation. More specifically, system bus controller 31 outputs a memory read request onto system bus 12 and at the same time causes driver 26 to output the memory address signal designated by memory address counter 32 (i.e., memory read address data for address 208H of memory bank B2) onto system bus 12.

When a memory read request is generated, system bus controller 31 outputs memory request timing signal S1. Memory address counter 32 is incremented by 4 and the next memory address 20CH is set. At the same time, transfer word counter 33 is decremented by one. Bit 28 of address 20CH is logic "1" and coincides with that of the previous address signal (corresponding to address 208H) sent onto system bus 12. In this case, the output signal from comparator 36 is set at logic "0" representing a bank coincidence, as is shown in FIG. 4M. Therefore, memory read request-inhibit signal S4, as an output signal from NAND gate 39, is logic "1", and system bus controller 31 outputs the next memory read request for memory bank B2, on the basis of address 20CH, after the memory read request for memory bank B1 is output on the basis of address 208H.

In the above description, the number of memory banks is two. However, the present invention can be applied to a system having a main memory with four or more memory banks. In the above embodiment, data transfer is performed using a data length which is ½ the data length of memory interleaving. However, data may be transferred using a data length which is ¼ the data length of memory interleaving, as is apparent from the spirit and scope of the present invention.

Also, in the embodiment, F/F 38 is set at the leading edge of signal S1 and is reset at the trailing edge of signal S3. However, F/F 38 may be set at the trailing edge of signal S1 and may be reset at the leading edge of signal S3.

What is claimed is:

1. A channel apparatus, connected by an m bit data bus to a memory section having a plurality of memory banks under interleaving control in units of m times n bits, each respective memory bank having predetermined memory addresses assigned to the respective memory bank, the memory banks for outputting data blocks in response to a sequence of memory addresses such that any moment in the sequence may be defined by a current memory address and a previous memory address in the sequence of memory addresses, said channel apparatus comprising:
  address output means, connected to the plurality of memory banks for outputting the previous memory address in the sequence of memory addresses to said memory section in response to an address output instruction, for generating the current memory address in the sequence of the memory addresses, and for retaining the current memory address;
  comparing means for comparing the current memory address with the previous memory address to determine whether the current memory address and the previous memory address are assigned to the same respective memory bank, and for generating a noncoincidence signal when the current memory address and the previous memory address are not assigned to the same respective memory bank;
  counting means for counting a number of memory addresses output from said address output means, in response to the noncoincidence signal from said comparing means, for counting a number of the data blocks output by said memory section, and for generating an inhibition instruction until the counted number of data blocks reaches the counted number of memory addresses, whereby the channel apparatus determines that a full m times n bits of memory address have been read to the respective assigned memory bank;

control means, connected to the address output means, the comparing means the counting means, for generating and outputting the address output instruction to said address output means in response to a data transfer command, and for inhibiting generation of the address output instruction in response to the inhibition instruction from said counting means, whereby each respective memory bank reads data in the same sequence as said sequence of the m times n bit memory addresses.

2. An apparatus according to claim 1, wherein said apparatus is connected to said memory section through a bus having an m-bit data width, and the number of memory addresses is n.

3. An apparatus according to claim 1, further comprising second counting means for counting a number of data blocks received from said memory section, and for generating a completion indication when the counted number of data blocks reaches a predetermined number which is designated by the data transfer command, and wherein said control means further comprises means for inhibiting the generation of the address output instruction in response to the completion indication from said second counting means.

4. An apparatus according to claim 1, wherein said control means further comprises means for outputting a memory request to said memory section when the address output instruction is output to said address output means, said memory section outputs a response to said apparatus together with the data block, and said counting means includes means for counting a number of responses as the number of data blocks.

5. An apparatus according to claim 1, wherein said counting means includes means for counting a number of address output instructions as the number of memory addresses output from said address output means.

6. A method of reading out data blocks, across a data bus of m bit capacity, from a memory in response to generated memory addresses of m times n bits and in an order of the generated memory address, the memory having a plurality of memory banks under interleaving control in units of m times n, each respective memory bank having predetermined memory addresses assigned to the respective memory bank, comprising the steps of:

(1) sequentially generating an address output instruction in response to a data transfer command;

(2) outputting a retained memory address as a previous memory address to said memory in response to the address output instruction;

(3) updating the retained memory address from the previous memory address to a current memory address;

(4) comparing the current memory address with the previous memory address to generated a noncoincidence signal when the current memory address is not assigned to the same respective memory bank as the previous memory address;

(5) repeating steps 2–4 until a noncoincidence signal is generated;

(6) counting the number of memory addresses output from said address output means;

(7) generating a count start instruction in response to the noncoincidence signal;

(8) counting a number of data blocks received from said memory in response to the count start instruction;

(9) generating an inhibition instruction until the counted number of data blocks coincides with the number of memory addresses output from said address output means to determine that n data blocks have been read from the memory;

(10) resetting the number of data blocks and the number of memory addresses when the counted number of data blocks coincides with the number of memory addresses output from the address output means; and

(11) inhibiting generation of the address output instruction in response to the inhibition instruction to ensure that all data blocks corresponding to the m times n memory address are readout before generation of the address output instructions continues.

7. A method according to claim 6, wherein each memory address corresponds to a m-bit data block.

8. A method according to claim 6, further comprising the step of:

generating a completion indication when the counted number of data blocks reaches a predetermined number which is determined by the data transfer command, and wherein said inhibiting step further comprises inhibiting the generation of the address output instruction in response to the completion indication.

9. A method according to claim 6, wherein said step of outputting the memory address further comprises outputting a memory request to said memory when the address output instruction is generated, said memory outputs a response to said apparatus together with a data block, and said counting step includes counting a number of responses as the number of data blocks.

10. A method according to claim 6, wherein said counting step includes counting a number of address output instructions as the number of memory addresses.

11. A channel apparatus, connected by an m bit data bus to a memory section having a plurality of memory banks under interleaving control in units of m times n bits, each respective memory bank having predetermined memory addresses assigned to the respective memory bank, the memory banks for outputting data blocks in response to a sequence of memory addresses such that any moment in the sequence may be defined by a current memory address and a previous memory address in the sequence of memory addresses, said channel apparatus comprising:

memory access means for sequentially generating and outputting a series of memory addressees to said memory section in response to an input data transfer command and for inhibiting generation of the series of memory addresses in response to an inhibition instruction;

comparing means for comparing a first memory address of the series of memory addresses with a second memory address of the series of memory addresses previous to the first memory address to determine whether the first memory address and the second memory address are assigned to the same respective memory bank, and for generating a noncoincidence signal when the first memory address and the second memory address are not assigned to the same respective memory bank;

counting means for, in response to the noncoincidence signal, counting a number of the data blocks received from said memory, for generating a inhibition instruction until the counted number of data blocks reaches a predetermined number, and for resetting the counted number of data blocks, whereby a respective, assigned memory bank reads data in the same sequence as the sequence of m times n bit memory addresses.

12. An apparatus according to claim 11, wherein said apparatus is connected to said memory section through a bus having an m-bit data width, each memory address corresponding to an m-bit data block.

13. An apparatus according to claim 11, further comprising second counting means for counting a number of data blocks received from said memory section, and for generating a completion indication when the counted number of data blocks reaches a second predetermined number which is designated by the data transfer command, and wherein said memory access means further comprises means for stopping the generation of the series of memory addresses in response to the completion indication from said second counting means.

* * * * *